US012795809B2

(12) United States Patent
Brinkmann

(10) Patent No.: US 12,795,809 B2
(45) Date of Patent: Nov. 10, 2026

(54) PRINTED CIRCUIT BOARD AND METHOD FOR SOLDERING A CHIP HOUSING IN A PROCESS-RELIABLE MANNER

(71) Applicant: Lisa Dräxlmaier GmbH, Vilsbiburg (DE)

(72) Inventor: Andreas Brinkmann, Dachau (DE)

(73) Assignee: LISA DRÄXLMAIER GMBH, Vilsbiburg (DE)

( * ) Notice: Subject to any disclaimer, the term of this patent is extended or adjusted under 35 U.S.C. 154(b) by 0 days.

(21) Appl. No.: 18/572,369

(22) PCT Filed: Jun. 30, 2022

(86) PCT No.: PCT/EP2022/068135
§ 371 (c)(1),
(2) Date: Dec. 20, 2023

(87) PCT Pub. No.: WO2023/275287
PCT Pub. Date: Jan. 5, 2023

(65) Prior Publication Data

US 2024/0292514 A1 Aug. 29, 2024

(30) Foreign Application Priority Data

Jul. 2, 2021 (DE) ........................ 102021117131.8

(51) Int. Cl.
*B23K 1/00* (2006.01)
*B23K 101/42* (2006.01)
(Continued)

(52) U.S. Cl.
CPC ......... *H05K 1/0204* (2013.01); *B23K 1/0016* (2013.01); *H05K 1/0209* (2013.01);
(Continued)

(58) Field of Classification Search
CPC ...... B23K 1/0016; B23K 1/00; B23K 101/42; B23K 2101/42; H01L 23/3677;
(Continued)

(56) References Cited

U.S. PATENT DOCUMENTS

| | | | |
|---|---|---|---|
| 6,611,055 | B1 | 8/2003 | Hashemi |
| 2002/0050380 | A1 | 5/2002 | Tanimura et al. |

(Continued)

FOREIGN PATENT DOCUMENTS

| | | | |
|---|---|---|---|
| DE | 202009016959 U1 | 5/2010 |
| EP | 1377144 A2 | 2/2004 |

(Continued)

OTHER PUBLICATIONS (In German) PCT/EP2022/063135 International Search Report dated Nov. 8, 2022.
(In English) PCT/EP2022/068135 International Search Report in German dated Nov. 8, 2022.
(In German) German Patent Office Examination of 102021117131.8 dated May 3, 2022.
(In English) German Patent Office Examination of 102021117131.8 dated May 3, 2022.

(Continued)

*Primary Examiner* — Guillermo J Egoavil
(74) *Attorney, Agent, or Firm* — BelayIP

(57) ABSTRACT

The present disclosure relates to a method for the process-reliable soldering of a chip package onto a printed circuit board for the process-reliable soldering of a chip package. The printed circuit board has a metallic cooling surface, a plurality of metallic contact surfaces surrounding the cooling surface, and, on a side opposite the cooling surface, a rear metallic mating surface, the mating surface being connected to the cooling surface by open vias, and lanes of solder resist being arranged on the cooling surface, which lanes both divide the cooling surface into a plurality of partial surfaces and enclose the vias.

13 Claims, 3 Drawing Sheets

(51) Int. Cl.

| | |
|---|---|
| ***H05K 1/02*** | (2006.01) |
| ***H05K 1/18*** | (2026.01) |
| ***H05K 3/34*** | (2026.01) |
| ***H05K 3/341*** | (2026.01) |
| ***H05K 3/3452*** | (2026.01) |
| ***H05K 3/3485*** | (2026.01) |
| *H05K 1/181* | (2026.01) |

(52) U.S. Cl.

CPC ......... *H05K 3/3421* (2013.01); *H05K 3/3452* (2013.01); *H05K 3/3485* (2020.08); *B23K 2101/42* (2018.08); *H05K 1/181* (2013.01); *H05K 2201/0305* (2013.01); *H05K 2201/0989* (2013.01); *H05K 2201/09909* (2013.01); *H05K 2201/10689* (2013.01); *H05K 2203/0557* (2013.01); *H05K 2203/1178* (2013.01)

(58) Field of Classification Search

CPC ............ H01L 23/49838; H05K 1/0204; H05K 1/0209; H05K 1/181; H05K 1/02; H05K 1/18; H05K 2201/0305; H05K 2201/09781; H05K 2201/0989; H05K 2201/09909; H05K 2201/10689; H05K 2203/0557; H05K 2203/1178; H05K 3/3421; H05K 3/3452; H05K 3/3485; H05K 3/34

USPC .......................................................... 361/748

See application file for complete search history.

(56) References Cited

U.S. PATENT DOCUMENTS

| | | | | |
|---|---|---|---|---|
| 2003/0234441 | A1* | 12/2003 | Delheimer | H05K 1/0206 257/E23.06 |
| 2007/0158102 | A1 | 7/2007 | Monroe | |
| 2018/0199425 | A1 | 7/2018 | Edlinger et al. | |

FOREIGN PATENT DOCUMENTS

| | | | |
|---|---|---|---|
| EP | 1377144 | A3 | 9/2005 |
| JP | 000H07288375 | A | 10/1995 |
| JP | 11233926 | A | 8/1999 |
| JP | 000003385872 | B2 | 10/2003 |
| JP | 2006147723 | A | 6/2006 |
| JP | 2017152459 | A | 6/2017 |
| WO | WO2019071283 | A | 4/2019 |

OTHER PUBLICATIONS

English Language Machine Translation of JP2006147723A.
English Language Machine Translation of JP2017152459A.
English Language Machine Translation of JP11233926A.
English Language Machine Translation of JP000H07288375A.
English Language Machine Translation of DE202009016959U1.
English Language Machine Translation of JP000003385872B2.
English Language Machine Translation of WO2019071283A1.

* cited by examiner

PRINTED CIRCUIT BOARD AND METHOD FOR SOLDERING A CHIP HOUSING IN A PROCESS-RELIABLE MANNER

CROSS REFERENCE TO RELATED APPLICATIONS

This application is a national phase application of International Application No.: PCT/EP2022/068135, filed on Jun. 30, 2022, and further claims priority to German patent application 102021117131.8, filed on Jul. 2, 2021, the content of both of which is incorporated herein by reference.

BACKGROUND OF THE INVENTION

Field of the Invention

The present invention relates to a printed circuit board for the process-reliable soldering of a chip package, and to a method for the process-reliable soldering of a chip package onto such a printed circuit board.

The present invention is described below mainly in connection with chip housings with circumferentially arranged contact feet and a central heat dissipation surface. The chip package can, for example, encase an integrated circuit. However, the invention can also be used for other solder connections in which a good thermal connection of flat components to cooling surfaces is desired.

Description of Related Art

Electronic components of an electrical circuit can be connected to each other via conductor tracks formed in a printed circuit board. The electronic components can be soldered to the circuit board. A reflow soldering process can be used as the soldering method. In the reflow soldering process, solder paste is dispensed onto contact surfaces of the printed circuit board, the electronic components are placed on the dispensed solder paste and everything is then heated together to melt the solder paste.

If the electronic components have heat dissipation surfaces to dissipate heat, the heat dissipation surfaces can be thermally connected to the cooling surfaces of the PCB during the reflow soldering process. In order to ensure good heat transfer, a connection with as large an area as possible is required.

During the melting of the solder paste, flux gases out of the solder paste. The gaseous flux can form voids in flat solder joints and thus impair the heat transfer. Furthermore, manufacturer specifications for maximum acceptable cavities between the heat dissipation surfaces and the cooling surfaces (voiding) can often not be met.

BRIEF SUMMARY OF THE INVENTION

An object of the invention is therefore to provide an improved printed circuit board for the reliable soldering of a chip package and an improved method for the reliable soldering of a chip package onto such a printed circuit board, using means that are as simple as possible in terms of design. An improvement can, for example, relate to a reduction of defects in the solder joint, in particular a large-area thermal connection.

In the case of flat solder joints, for example between a heat dissipation surface of a chip housing and a circuit board, a free surface of the solder may not be large enough to allow all flux components or flux outgassing from the solder to escape while the solder is liquid. The gaseous flux can become trapped in the solidifying solder and form bubbles. The bubbles can impair heat transfer, for example by reducing the possible heat transfer surface of the solder joint.

Similarly, a gap between a cooling surface of a printed circuit board and the heat dissipation surface can be too large to bridge with solder, at least in some areas, due to tolerances in the contact pads of the circuit. This can result in a gap forming between the heat dissipation surface and the solder, which also impairs heat transfer or reduces the possible heat transfer surface of the solder joint.

A printed circuit board for process-reliable soldering of a chip package is proposed, wherein the printed circuit board has a metallic cooling surface, a plurality of metallic contact surfaces surrounding the cooling surface, as well as a rear metallic counter surface on a side opposite the cooling surface, wherein the counter surface is connected to the cooling surface by open vias, and lanes of solder resist are arranged on the cooling surface, which both divide the cooling surface into a plurality of partial surfaces and enclose the vias.

Furthermore, a method for the process-reliable soldering of a chip package onto a printed circuit board is proposed, wherein in a step of providing a printed circuit board is provided according to the approach presented here, in a step of dispensing solder paste is dispensed onto the partial surfaces and contact surfaces, in a mounting step, a central heat dissipation surface of the chip housing is arranged over the cooling surface and peripheral contact feet of the chip housing are arranged over the contact surfaces, in a soldering step, the printed circuit board with the chip housing is heated to a soldering temperature, the solder paste melts into solder at the soldering temperature, the solder bonds with the contact pads and the contact surfaces, as well as with the heat dissipation surface and the partial surfaces of the cooling surface, the contact pads are placed on the contact surfaces and thus define a distance between the heat dissipation surface and the cooling surface, the solder outgasses through the vias, excess solder flows off through the vias onto the mating surface, connects with the mating surface and runs on the mating surface, and in a cooling step the solder solidifies on the contact surfaces and contact feet, between the heat dissipation surface and the partial surfaces, and on the mating surface.

A printed circuit board can be understood as a carrier component for an electrical circuit. The printed circuit board can have metallic contact surfaces connected by metallic conductor tracks. The contact surfaces can be referred to as contact pads. A carrier material of the printed circuit board can be electrically insulating.

The conductor tracks can be printed or etched onto a layer of the PCB, for example. The conductor tracks can run both within the PCB and on a surface of the PCB. This allows the PCBs to cross each other, for example, without being electrically connected to each other.

The contact surfaces can be arranged on the surface of the printed circuit board. The printed circuit board can also have other metallic areas on its surface. The metallic surfaces can also be printed or etched on a layer of the printed circuit board. These metallic surfaces can, for example, be designed as cooling surfaces for components of the electrical circuit arranged on the printed circuit board. Cooling surfaces can be referred to as cooling pads. Depending on the requirements, the cooling surfaces can be part of a conductor track or a contact surface or can also be electrically insulated. The contact surfaces and cooling surfaces can be made of a copper material, for example.

A via can be described as a through-hole connection. The via penetrates the layers of the PCB essentially perpendicular to the surface of the PCB. The via can also consist of a copper material. An open via has a channel running from one side of the PCB to the other. The open via can correspond to a metallic tube. The via can electrically and thermally connect two metallic surfaces on both sides of the PCB. In particular, the cooling surface can be connected by several open vias to a metallic surface of the printed circuit board known as the mating surface. The vias can connect the cooling surface and the mating surface, in particular thermally.

Solder resist can prevent a connection between a surface covered with solder resist and solder. The solder resist prevents wetting of the surface. Liquid solder has a large contact angle to a surface covered with solder resist. Solder only flows onto the solder resist due to external forces and rolls off. The solder resist separates the solder on the partial surfaces of the cooling surface. An aisle can have a predetermined width. The lanes can be continuous. The lanes can run around the vias. The vias can be separated from the partial surfaces by the solder resist in order to interrupt a capillary effect.

A chip housing can encase an integrated circuit. The chip housing can be predominantly made of a plastic material. The chip housing can have a metallic surface on its underside to dissipate heat. This surface can be referred to as a heat dissipation surface. Metallic contact feet of the chip housing can protrude laterally from the chip housing and be cranked towards the underside. The contact feet can protrude beyond a plane of the heat dissipation surface.

Solder paste can essentially consist of metallic solder particles and flux. When heated to a predetermined soldering temperature, the solder particles melt and combine to form liquid solder. The soldering temperature can be up to 250° C., for example. The flux enables metallic surfaces to be wetted by the solder, for example by removing an oxide layer from the surface before it evaporates. In the process, the flux separates from the solder. The solder then bonds with the surface. The solder resist does not or only slightly reacts with the flux.

Due to the lanes, there are channels in the solder between the heat dissipation surface and the cooling surface through which the gaseous flux can flow out with low resistance. Furthermore, the surface area for outgassing is increased due to the one large copper surface being split into several smaller ones. When the contact feet rest on the contact surfaces, a volume of space is defined between the heat dissipation surface and the cooling surface. The solder fills this space. If there is more solder between the heat dissipation surface and the cooling surface than the volume of the gap before placement, excess solder is pressed through the vias to the opposite side due to the resulting excess pressure in the solder. The gaseous flux can also escape from the gap through the open vias.

There is no solder resist on the opposite side, which is why the liquid solder wets the opposite side and spreads over it. This also reliably prevents solder beads.

The partial surfaces can be arranged in a grid pattern, in particular equidistantly, across the cooling surface. The lanes can be arranged in a grid pattern. The lanes can run essentially in a straight line. The partial areas can be essentially the same size.

The vias can be arranged in a grid pattern across the cooling surface. The vias can be arranged at regular intervals across the cooling surface. Due to the distributed vias, the liquid solder and the gaseous flux do not have a long path anywhere to reach the opposite side. Short paths result in a low necessary overpressure in the solder and flux. The low overpressure results in few inclusions in the solder.

The solder paste can be dispensed onto the partial surfaces with a greater layer thickness than onto the contact surfaces. The solder paste can be dispensed with a thinner layer thickness on the contact surfaces. Due to the greater layer thickness in the area of the partial surfaces, the volume of the gap between the heat dissipation surface and the cooling surface can be reliably filled. For example, the solder paste can be dispensed on the partial areas with a layer thickness of more than 150 μm or more than 200 μm, for example 250 μm. The layer thickness on the partial surfaces can be at least 50%, at least 75% or even at least 100% thicker than on the contact surfaces, for example.

The solder paste can be dispensed onto the partial surfaces with a greater layer thickness than a maximum distance between the heat dissipation surface and the cooling surface. The volume of the solder can decrease compared to the original volume of the solder paste due to outgassing of the flux. This volume loss can be compensated for by increasing the layer thickness of the solder paste.

A template with cut-outs can be used in the dispensing step. The cut-outs can represent the contact surfaces and the partial surfaces. The solder paste can be squeegeed through the cut-outs. The solder paste can be dispensed quickly and easily using the stencil. When squeegeeing, a supply of solder paste can be pressed into the cut-outs using a squeegee, similar to screen printing.

A stepped stencil with a greater material thickness can be used in the area of the cut-outs for the partial surfaces than in the area of the cut-outs for the contact surfaces. Due to the different material thicknesses, different layer thicknesses of solder paste are squeegeed through the cut-outs.

A thinned squeegee can be used for squeegeeing. A thinned squeegee can have a thinner squeegee edge than a standard squeegee. The thinned squeegee can have increased flexibility in order to compensate for the differences in the material thickness of the stencil.

BRIEF DESCRIPTION OF THE SEVERAL VIEWS OF THE DRAWINGS

Further advantages, features, and details of the various embodiments of this disclosure will become apparent from the ensuing description of a preferred exemplary embodiment and with the aid of the drawings. The features and combinations of features recited below in the description, as well as the features and feature combination shown after that in the drawing description or in the drawings alone, may be used not only in the particular combination recited, but also in other combinations on their own, without departing from the scope of the disclosure. An advantageous embodiment of the present invention is set out below with reference to the accompanying figures, wherein.

The figures are merely schematic representations and serve only to explain the invention. Identical or similarly acting elements are consistently provided with the same reference signs.

DETAILED DESCRIPTION OF THE INVENTION

As used throughout the present disclosure, unless specifically stated otherwise, the term "or" encompasses all possible combinations, except where infeasible. For example, the expression "A or B" shall mean A alone, B alone, or A and B together. If it is stated that a component includes "A, B, or C", then, unless specifically stated otherwise or infeasible, the component may include A, or B, or C, or A and B, or A and C, or B and C, or A and B and C. Expressions such as "at least one of" do not necessarily modify an entirety of the following list and do not necessarily modify each member of the list, such that "at least one of "A, B, and C" should be understood as including only one of A, only one of B, only one of C, or any combination of A, B, and C.

Figure 1:
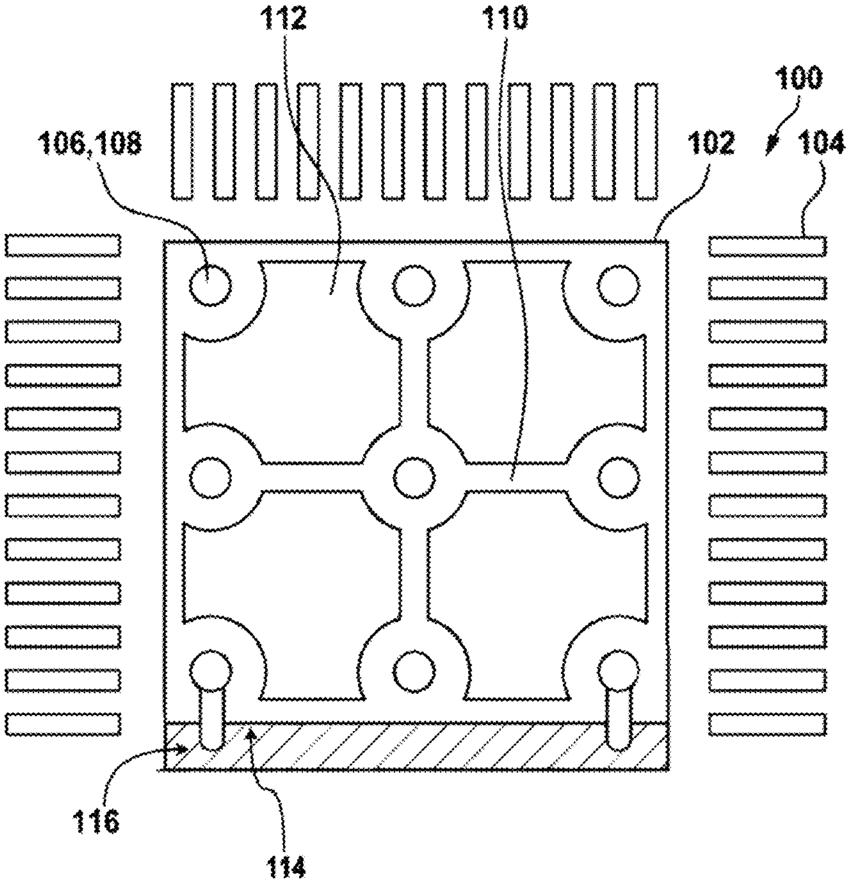
FIG. 1 depicts an illustration of a printed circuit board according to an embodiment example.

FIG. 1 shows an illustration of a printed circuit board 100 according to an embodiment example. The printed circuit board 100 is configured for the process-safe soldering of a chip package onto a front side of the printed circuit board. The front side can be referred to as the mounting side. The printed circuit board 100 has a metallic cooling surface 102 on the front side. The cooling surface 102 is provided to dissipate heat from the chip package. A plurality of metallic contact surfaces 104 surround the cooling surface 102. On a rear side opposite the front side, the printed circuit board 100 has a rear-side metallic mating surface 116. The mating surface 116 is connected to the cooling surface 102 by open vias 106. The mating surface is essentially as large as the cooling surface and has a similar contour. The vias 106 extend from the front side to the rear side. Heat can be dissipated from the cooling surface 102 to the mating surface via the vias 106 and radiated to the rear via the mating surface 116. The vias 106 each have a channel 108 extending from the front to the rear. Excess solder can flow through the channels 108 to the opposite side during soldering. The channels 108 also allow outgassing flux to escape via the rear side. Lanes 110 made of solder resist are arranged on the cooling surface 102. The lanes 110 divide the cooling surface 102 into several partial surfaces 112. The lanes 110 also enclose the vias 106. No solder resist is arranged on the opposite surface.

In one embodiment, the cooling surface 102 is approximately square and is connected to the mating surface via nine vias 106 arranged in a grid pattern. The vias 106 are each arranged in the corners of the cooling surface 102, at the centers of side edges of the cooling surface 102 and at an intersection of diagonals of the cooling surface 102. The lanes 110 are aligned at right angles to the side edges. The lanes 110 intersect at the intersection of the diagonals and divide the cooling surface 102 into four partial surfaces 112 arranged in a grid pattern. Each partial surface 112 is thus surrounded by four of the vias 106.

In one embodiment example, each via 106 is surrounded by a surface 114 covered with solder resist. The channels 108 are centered in the surfaces 114. The surfaces 114 are approximately circular. A distance between an edge of the respective channel 108 and an edge of the partial surface 112 essentially corresponds to a width of the lanes 110.

Figure 2:
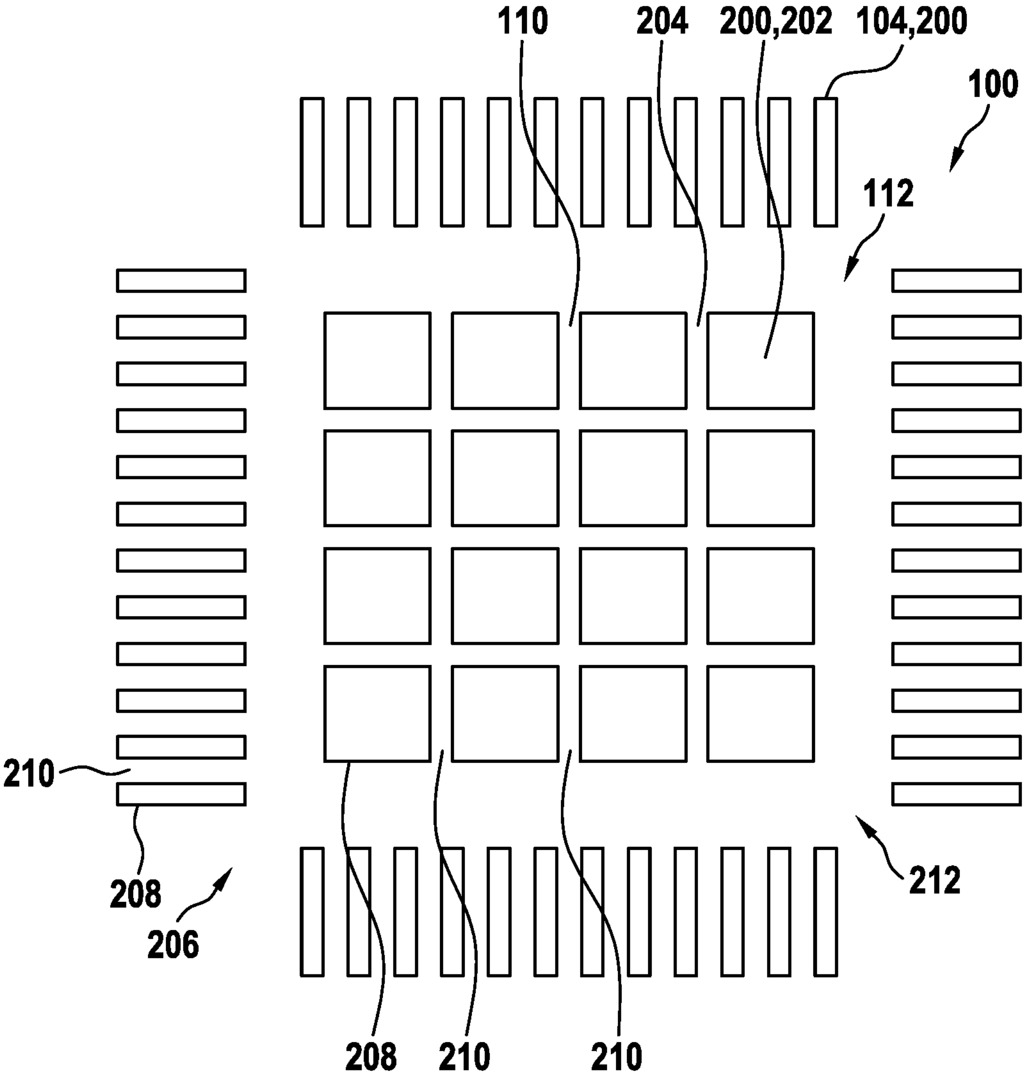
FIG. 2 depicts an illustration of dispensing solder paste onto a printed circuit board according to an embodiment example.

FIG. 2 shows an illustration of a dispensing of solder paste 200 onto a printed circuit board 100 according to an embodiment example. The printed circuit board 100 essentially corresponds to the illustration in FIG. 1. The solder paste 200 has been dispensed onto the contact surfaces 104 and onto the partial surfaces 112 of the cooling surface 102. No solder paste 200 has been dispensed onto the lanes 110.

In one embodiment example, four portions 202 of solder paste 200 have been dispensed onto each partial surface 112. The portions 202 are arranged at a slight distance from one another on each partial surface 112. Strips 204 of the partial surfaces 112 are thus exposed between the portions 202. The strips 204 are arranged in a cross shape.

In one embodiment, a stencil 206 is used for dispensing. The stencil 206 is arranged on the printed circuit board 100 for dispensing and covers it at least in some areas. The solder paste 200 is placed on a rear side of the stencil 206 for dispensing and pushed over the rear side using a squeegee. The stencil 206 has cutouts 208 where the solder paste 200 is to pass through the stencil 206 onto the front side of the printed circuit board 100.

The cut-outs 208 are located here in the area of the contact surfaces 104 and the cooling surface. The stencil 206 has webs 210 between the individual cut-outs 208. The webs 210 mask the printed circuit board 100 locally and prevent the solder paste 200 from being applied. Webs 210 are arranged between all contact surfaces 104. Similarly, webs 210 are arranged above all lanes 110 and vias. The strips 204 are also kept free by webs 210.

In one embodiment example, the solder paste 200 has been dispensed with a greater layer thickness on the partial surfaces 112 than on the contact surfaces 104. As a result, more solder paste 200 is stored per surface in the area of the cooling surface than in the area of the contact surfaces 104.

In one embodiment example, the solder paste 200 is dispensed onto the partial surfaces 112 thicker than a maximum distance provided by the design between the chip housing and the printed circuit board 100. As a result, the solder paste 200 forms a solder paste deposit 212 in the area of the cooling surface to compensate for component tolerances. If the actual distance between the chip housing and the printed circuit board is greater than the maximum distance intended by the design, a gap between the heat dissipation surface of the chip housing and the cooling surface can nevertheless be prevented, since additional solder paste 200 is stored in the solder paste depot 212 to fill the gap.

If the actual distance is within the range of the maximum distance specified in the design, excess solder flows through the vias 106 to the rear and runs along the mating surface.

When using a stencil 206 for dispensing, the different layer thicknesses are specified by stencil areas of different thicknesses. The stencil 206 is then referred to as a stepped stencil. In this case, the stencil 206 has a greater material thickness in the area of the cooling surface than in the area of the contact surfaces 104. A thinned squeegee with a flexible edge is used so that the squeegee can follow the differences in material thickness of the stencil 206.

Figure 3:
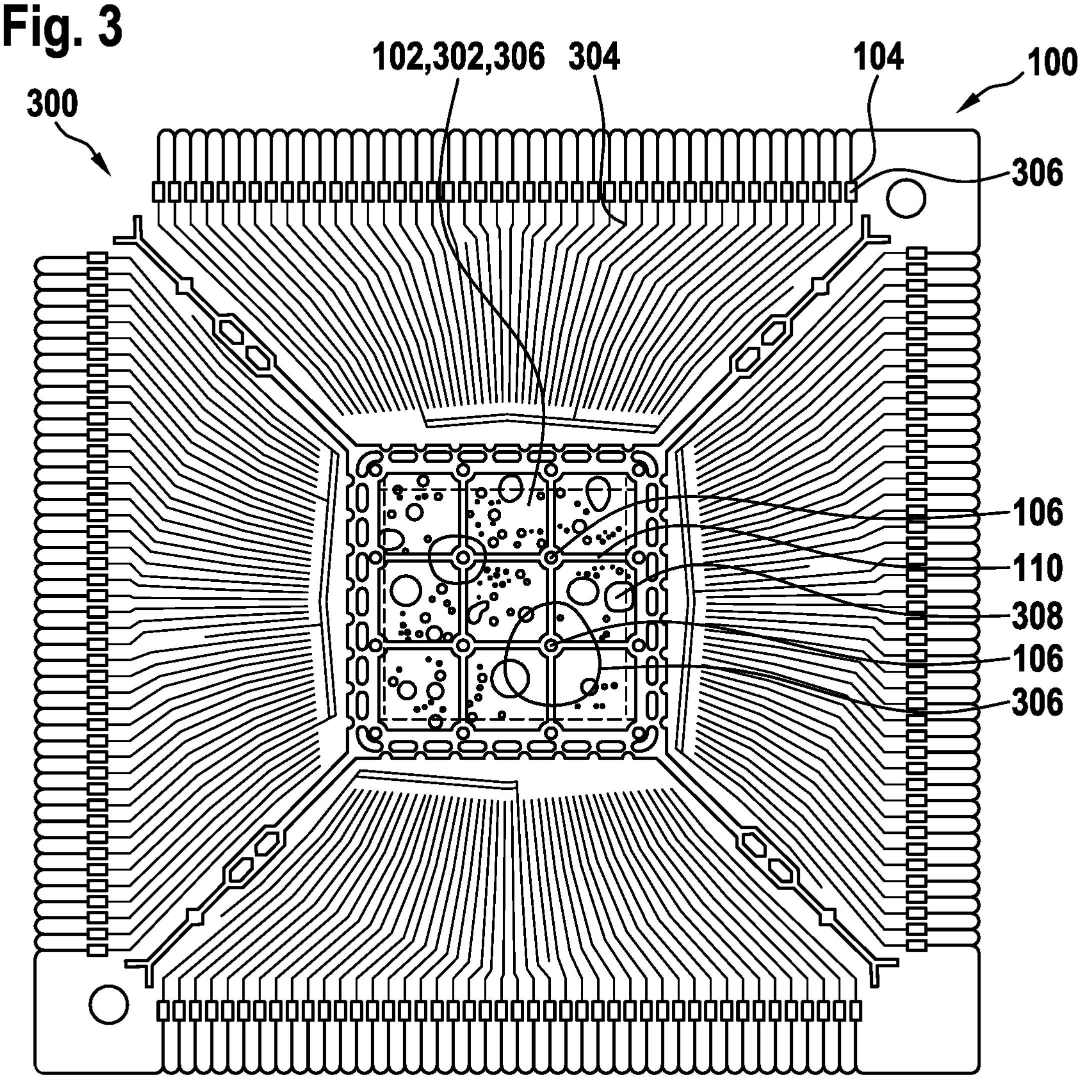
FIG. 3 depicts an illustration of a chip package soldered onto a printed circuit board according to an embodiment example.

FIG. 3 shows a representation of a chip package 300 soldered onto a printed circuit board 100 according to an embodiment example. The printed circuit board 100 essentially corresponds to the illustration in FIGS. 1 and 2. The chip housing 300 has a metallic heat dissipation surface 302 and a plurality of metallic contact feet 304 all around. The heat dissipation surface 302 is thermally conductively connected to the cooling surface 102 of the printed circuit board 100 by solder 306. The contact feet 304 are electrically conductively connected to the contact surfaces 104 of the printed circuit board 100 by the solder 306.

The chip housing 300 has been soldered to the printed circuit board 100 using a reflow soldering process. For this purpose, the chip housing 300 has been placed on the solder paste dispensed as shown in FIG. 2 in such a way that the heat dissipation surface 302 is arranged above the cooling surface 102, while the contact feet 304 are arranged above the contact surfaces 104.

The circuit board 100, the solder paste and the chip housing are then heated to the soldering temperature of the solder paste. The solder paste melts into liquid solder 306 and the flux contained in the solder paste prepares the metal surfaces for wetting by the liquid solder 306. The flux evaporates in the process. Vaporization can be described as outgassing.

In the approach presented here, the gaseous flux in the area of the heat dissipation surface 302 can escape to the side or through the open vias 106 to the rear of the printed circuit board 100 to a predominant extent through the solder-free lanes 110 held in place with solder resist. Only a small proportion of the flux forms pores 308 enclosed in the solid solder 306. The gaseous flux can escape so well from the space between the cooling surface 102 and the heat dissipation surface 302 that a porosity of less than 20 percent is achieved in the area of the heat dissipation surface 302.

When the solder paste has melted, the chip housing 300 sinks so far onto the printed circuit board 100 that the contact feet 304 rest on the associated contact surfaces 104. The contact feet 304 thereby define an adjusting distance between the heat dissipation surface 302 and the cooling surface 102. If excess liquid solder 306 is present in the space between the cooling surface 102 and the heat dissipation surface 302, the excess solder 306 flows down the alleys 110 and through the open vias 106 where it runs on the mating surface since no solder resist is applied there. The excess solder 306 fills up the vias 106 through which it flows.

In other words, a high void content of solder joints can lead to poor and unreliable solder connections on QFP components with a large gap between the component and the PCB (standoff tolerances 50 to 150 μm). This means that consistent and reproducible soldering results cannot be achieved.

In the approach presented here, so-called "Solder Mask Defined Pads" are used as an array. These solder mask-defined pads promote the outgassing of the flux. A stepped stencil and a thinned squeegee allow solder paste to be applied in different thicknesses. A mating surface is connected via vias for heat dissipation. Excess solder is absorbed by the mating surface.

Although some contactable copper surface is lost by rasterizing into smaller individual pads, consistently high-quality and reproducible soldering results are achieved. The achievable low void percentage of the solder joints is important, as there are strict specifications here. For example, the void percentage can be kept below 20% using the approach presented here.

Since the devices and methods described in detail above are examples of embodiments, they can be modified to a wide extent by a person skilled in the art without departing from the scope of the invention. In particular, the mechanical arrangements and the proportions of the individual elements to one another are merely exemplary.

The invention claimed is:

1. A printed circuit board configured for process-reliable soldering of a chip package, the printed circuit board comprising:

a metallic cooling surface, a multiplicity of metallic contact surfaces arranged surrounding the cooling surface, and, a rear metallic mating surface on a side opposite the cooling surface, wherein the mating surface has a size and contour corresponding to a size and contour of the cooling surface, wherein the mating surface is connected to the cooling surface by a plurality of open vias each comprising a channel extending from the cooling surface to the rear metallic mating surface, wherein no solder resist is arranged on the rear metallic mating surface at least in regions around the open vias, and wherein lanes of solder resist are arranged on the cooling surface, the lanes forming solder-resist-defined pads on the cooling surface which both divide the cooling surface into a plurality of partial surfaces and enclose the open vias such that the lanes define solder-free channels between a heat dissipation surface of the chip package and the cooling surface for outgassing flux during soldering and excess solder, when present in a gap between the heat dissipation surface and the cooling surface during soldering, is able to flow through the open vias onto the rear metallic mating surface and to wet and spread on the rear metallic mating surface.

2. The printed circuit board according to claim 1 wherein the partial surfaces are arranged in a grid-like distribution dividing the cooling surface.

3. The printed circuit board according to claim 1, wherein the vias are arranged distributed in a grid-like manner enclosed within the cooling surface.

4. The printed circuit board according to claim 1, wherein the lanes of solder resist and the open vias are arranged in a grid pattern across the cooling surface such that the cooling surface is divided into four partial surfaces and nine of the open vias are arranged at corners of the cooling surface, at centers of side edges of the cooling surface, and at an intersection of diagonals of the cooling surface.

5. The printed circuit board according to claim 4, wherein each of the open vias is surrounded on the cooling surface by a surface covered with solder resist, the surface being approximately circular and centered on a channel of the respective open via, and a distance between an edge of the channel and an edge of an adjacent partial surface corresponds substantially to a width of the lanes of solder resist.

6. The printed circuit board according to claim 1, wherein the lanes of solder resist and the partial surfaces form an array of solder mask defined pads on the cooling surface that are configured to promote outgassing of flux and to separate solder on the partial surfaces from the open vias.

7. The printed circuit board according to claim 1, wherein the open vias are arranged in a grid pattern across the cooling surface at regular intervals such that liquid solder and gaseous flux have a shortest path from any location on the cooling surface through one of the open vias to the rear metallic mating surface.

8. The printed circuit board according to claim 1, wherein, when a chip package having a heat dissipation surface is soldered to the printed circuit board, a porosity of solder in an area of the heat dissipation surface above the cooling surface is less than 20 percent.

9. The printed circuit board according to claim 1, wherein solder paste is configured to be dispensed onto the partial surfaces with a greater layer thickness than onto the metallic contact surfaces so that a volume of the solder between the heat dissipation surface and the cooling surface fills a gap defined by contact feet of the chip package.

10. The printed circuit board according to claim 9, wherein the layer thickness of the solder paste on the partial surfaces is greater than a maximum distance between the heat dissipation surface of the chip package and the cooling surface.

11. The printed circuit board according to claim 9, wherein the solder paste on the partial surfaces has a layer thickness of more than 150 micrometers, in particular more than 200 micrometers.

12. The printed circuit board according to claim 1, wherein the printed circuit board is configured for dispensing solder paste using a stepped stencil having a greater material thickness in a region of cut-outs corresponding to the partial surfaces than in a region of cut-outs corresponding to the metallic contact surfaces.

13. The printed circuit board according to claim 12, wherein the printed circuit board is configured for dispensing solder paste using a thinned squeegee having a thinner squeegee edge with increased flexibility to follow differences in material thickness of the stepped stencil.

* * * * *